(12) United States Patent
Nawaz

(10) Patent No.: US 10,804,182 B2
(45) Date of Patent: Oct. 13, 2020

(54) SEMICONDUCTOR POWER MODULE COMPRISING GRAPHENE

(71) Applicant: ABB Power Grids Switzerland AG, Baden (CH)

(72) Inventor: Muhammad Nawaz, Bro (SE)

(73) Assignee: ABB Power Grids Switzerland AG, Baden (CH)

( * ) Notice: Subject to any disclaimer, the term of this patent is extended or adjusted under 35 U.S.C. 154(b) by 0 days.

(21) Appl. No.: 16/478,362

(22) PCT Filed: Dec. 13, 2017

(86) PCT No.: PCT/EP2017/082661
§ 371 (c)(1),
(2) Date: Jul. 16, 2019

(87) PCT Pub. No.: WO2018/134002
PCT Pub. Date: Jul. 26, 2018

(65) Prior Publication Data
US 2019/0333838 A1    Oct. 31, 2019

(30) Foreign Application Priority Data

Jan. 23, 2017   (EP) ..................................... 17152714

(51) Int. Cl.
*H01L 23/34*      (2006.01)
*H01L 23/373*     (2006.01)
(Continued)

(52) U.S. Cl.
CPC ........ *H01L 23/3738* (2013.01); *H01L 23/051* (2013.01); *H01L 23/367* (2013.01);
(Continued)

(58) Field of Classification Search
CPC . H01L 23/367; H01L 23/051; H01L 23/3738; H01L 23/62; H01L 24/72
(Continued)

(56) References Cited

U.S. PATENT DOCUMENTS 6,426,561 B1    7/2002  Lang et al.
7,538,436 B2 *  5/2009  Gunturi ................. H01L 23/051
                                                   257/773

(Continued)

FOREIGN PATENT DOCUMENTS

CN    103346225 A    10/2013
CN    103370786 A    10/2013
(Continued)

OTHER PUBLICATIONS

Extended European Search Report Application No. 17152714.6 Completed: Aug. 1, 2017; dated Aug. 7, 2017 8 Pages.
(Continued)

*Primary Examiner* — Luan C Thai
(74) *Attorney, Agent, or Firm* — Slater Matsil, LLP

(57) ABSTRACT

The invention is concerned with a semiconductor power module comprising an electrically and thermally conductive base plate (14) and a semiconductor chip (12) and where a first layer of graphene (32) is placed between the semiconductor chip (12) and the base plate (14) in electrical and thermal contact with a first side the base plate (14). Thereby the cooling of the semiconductor power module is improved.

20 Claims, 1 Drawing Sheet

(51) Int. Cl.
*H01L 23/051* (2006.01)
*H01L 23/367* (2006.01)
*H01L 23/62* (2006.01)
*H01L 23/00* (2006.01)

(52) U.S. Cl.
CPC .............. *H01L 23/62* (2013.01); *H01L 24/72* (2013.01); *H01L 2224/72* (2013.01)

(58) Field of Classification Search
USPC ........................................................ 257/712
See application file for complete search history.

(56) References Cited

U.S. PATENT DOCUMENTS

| | | | | |
|---|---|---|---|---|
| 8,890,197 | B2* | 11/2014 | Youn | ........................ H01L 33/08 257/100 |
| 9,099,567 | B2 | 8/2015 | Viswanathan et al. | |
| 2006/0118816 | A1 | 6/2006 | Gunturi et al. | |
| 2014/0110049 | A1 | 4/2014 | Yuen et al. | |
| 2014/0345843 | A1 | 11/2014 | Kirkor et al. | |
| 2015/0253089 | A1 | 9/2015 | Fan et al. | |

FOREIGN PATENT DOCUMENTS

| | | |
|---|---|---|
| DE | 112012006195 T5 | 12/2014 |
| EP | 1246242 A1 | 10/2002 |
| EP | 1403923 A1 | 3/2004 |
| EP | 2544229 A1 | 1/2013 |
| WO | 2012107482 A2 | 8/2012 |

OTHER PUBLICATIONS

International Preliminary Report on Patentability Application No. PCT/EP2017/082661 Completed: Dec. 19, 2018 14 Pages.
International Search Report & Written Opinion of the International Searching Authority Application No. PCT/EP2017/082661 Completed: Mar. 2, 2018; dated Mar. 9, 2018 12 Pages.

* cited by examiner

SEMICONDUCTOR POWER MODULE COMPRISING GRAPHENE

FIELD OF INVENTION

The present invention relates to a semiconductor power module.

BACKGROUND

In high power applications such as in power transmission and distribution systems, semiconductor components, often in in the form of semiconductor chips or dies, are used for a variety of purposes such as converting between direct current and alternating current and forming circuit breakers.

Due to the high voltage and current levels used, the number of chips needed is high. It is therefore common to place several such chips in a semiconductor power module, where the chips in the module may be connected in parallel and/or in series.

Examples of semiconductor power modules can be found in EP 2544229, WO 2012/107482, U.S. Pat. Nos. 6,426,561 and 9,099,567.

The current levels in such applications may thus be high. The semiconductor components may in some cases also be switched frequently. All in all, this may lead to a high power dissipation in the components.

Cooling is therefore an important aspect of a semiconductor power module.

SUMMARY OF THE INVENTION

One object of the present invention is therefore to improve the cooling of semiconductor chips in semiconductor power modules.

This object is achieved through a semiconductor power module comprising an electrically and thermally conductive base plate and a semiconductor chip, wherein there is a first layer of graphene between the semiconductor chip and the base plate in electrical and thermal contact with a first side of the base plate.

As graphene has excellent thermal conductivity, the cooling of the semiconductor chip is improved.

According to a first variation the semiconductor power module further comprises a second layer of graphene on a second, opposite side of the base plate, which aids in improving the cooling.

The thickness of at least the first layer of graphene may be in the range 1-10 nm and preferably in the range 2-4 nm.

According to another variation there may be a first metallic layer with low melting point between the chip and first layer of graphene, which has the advantage of improving the reliability of entering a short-circuit failure mode.

Moreover, the first metallic layer may comprise a metal or metal alloy layer, which may be of aluminum and/or silver. The alloy may more particularly be an aluminium silver alloy or an aluminium silicon carbide alloy.

According to another variation, the first metallic layer may be provided on a first side of the chip and a second metallic layer with low melting point may be provided on a second, opposite side of the chip in order to further enhance the reliability of entering of the short-circuit failure mode.

The melting point of the first and second metallic layers may be in the range 500-700° C.

According to a further variation the semiconductor power module may comprise a top electrode and an upper base plate on top of the second metallic layer. In this case the base plate may form a bottom electrode.

The semiconductor chip may with advantage be a silicon carbide chip. The base plate may in turn be of molybdenum.

According to another variation, the semiconductor power module may comprise a number of additional semiconductor chips, each connected to the base plate via the first layer of graphene.

BRIEF DESCRIPTION OF THE DRAWINGS

The present invention will in the following be described with reference being made to the accompanying drawings, where FIG. 1 schematically shows a semiconductor power module comprising a number of submodules, FIG. 2 schematically shows a submodule comprising a base plate and a number of semiconductor chips, and FIG. 3 schematically shows a part of the submodule provided in relation to one chip.

DETAILED DESCRIPTION OF THE INVENTION

Figure 1:
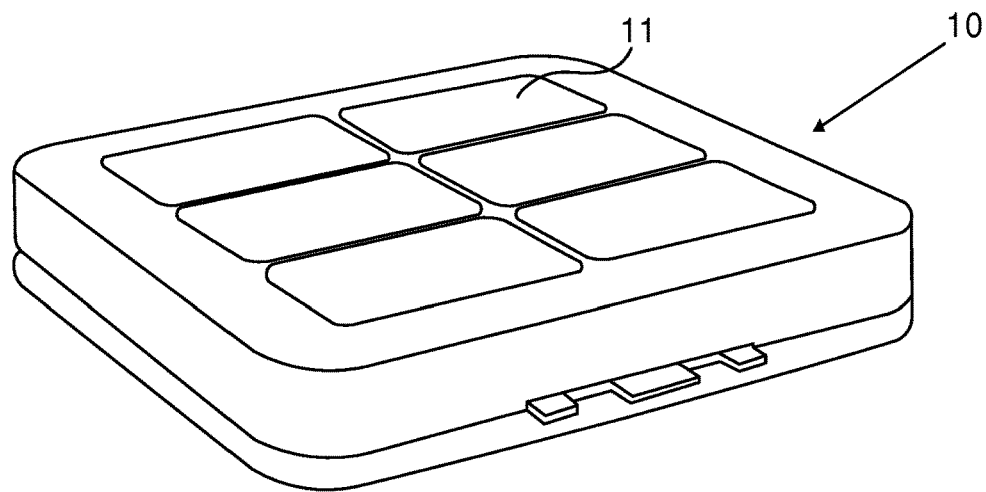

The present invention concerns semiconductor power modules for semiconductor chips or dies for instance for use in high voltage applications, such as in power transmission or distribution systems.

In such modules a number of semiconductor chips are provided in a structure that connects the chips either in parallel or in series.

In the field of semiconductor power modules the wide bandgap semiconductor, such as silicon carbide (SiC) semiconductor, is now believed to be the favorite candidate for a diverse range of power electronics applications in energy transmission and distribution systems. Hence, it offers potential replacement to leading horse silicon (Si) material counterpart used in a variety of semiconductor devices, such as Metal Oxide Semiconductor Field Effect Transistors (MOSFETs), Insulated-Gate Bipolar Transistors (IGBTs), Integrated Gate-Commutated Thyristors (IGCTs) etc., primarily because of higher field strength (i.e., 10× than that of Si), wider band gap (3× than that of Si), higher thermal conductivity (3× than that of Si), and higher carrier velocity (2× than that of Si). Earlier power electronic building blocks utilized in a variety of power converter topologies in energy transmission and distribution systems were mostly limited to Si based power switches such as (IGBTs) and (IGCTs). From a power system design point of view, semiconductor chips that enable reduced power losses, provide higher power density, facilitate compact converter design, lower environmental impact and simultaneously bring lower overall system cost will be considered key technological booster for very high power applications. With these key performance indicators in mind, finding a good solution in terms of chosen semiconductor technology that better fits the requirements given by the specific topologies and standardization of converter building block design presents one advancement in product development.

Recent trends in high power electronics have induced increasing demands on improving the efficiency of power converter on one side and simultaneously reducing the footprint of the power electronic building blocks on the other hand. A better thermal management is therefore a pre-requisite to achieve this objective especially when several power chips with high blocking voltages are sitting in parallel to achieve high current capability. This has further resulted in higher power dissipation densities for the IGBT die as well as the power module, due to denser packing of the die itself. On the other side, increase in the switching frequency and voltage ratings of IGBTs also result in higher power dissipation at the die level. A relaxed cooling requirement under continuous operation is therefore critical. A substandard cooling capability may limit the device performance.

In operation such semiconductor chips may thus carry high current and may at times be switched frequently and therefore generate a lot of heat. This makes cooling important.

Furthermore, for the power modules used in modular multilevel converter (MMC) for instance in High Voltage Direct Current (HVDC) applications, the switching device (i.e., Si-IGBTs) should carry the load current under short circuit failure mode (SCFM) condition for some period of time until the next maintenance. Accordingly, a very stable short circuit condition through the failed module must be formed and guaranteed until the system is serviced. This SCFM mode has an important consequence on the power module design since a single failed chip and its contact system should take up the whole module current of up to at least 1500 A (phase-rms), where rms denotes root mean square.

In a power module the reliable short circuit is typically obtained through the use of a metallic layer with low melting point, such as an Aluminum Silver (Al—Si) alloy, placed above the chip. When there is a short-circuit, this metallic layer melts and forms an alloy with the silicon of the chip due to high induced energy for short period of time. Hence the layer forms a low resistance stable alloy with the Si die. Note that metals like silver and aluminum are generally preferred as they form low melting eutectic alloys with silicon die underneath.

However, if an SiC semiconductor chip is used in the semiconductor power module, the operation of the switching device under SCFM condition in MMC may become unpredictable since the melting point of the SiC material is higher than that of the Si-counterpart and hence stable alloy formation that short-circuits the collector-emitter may be questionable.

A reliable short-circuit is thus also important.

Aspects of the invention are directed towards the above-mentioned two areas namely the area of improving cooling and improving the reliability of the SFCM mode, especially in relation to SiC chips.

The semiconductor power module may comprise a power module comprising one or more submodules, where such submodules may be electrically connected in series and/or in parallel with each other. A semiconductor power module to comprising six submodules 11 is shown in FIG. 1. It should be realized that a power module may comprise more or fewer submodules than the ones shown.

Figure 2:
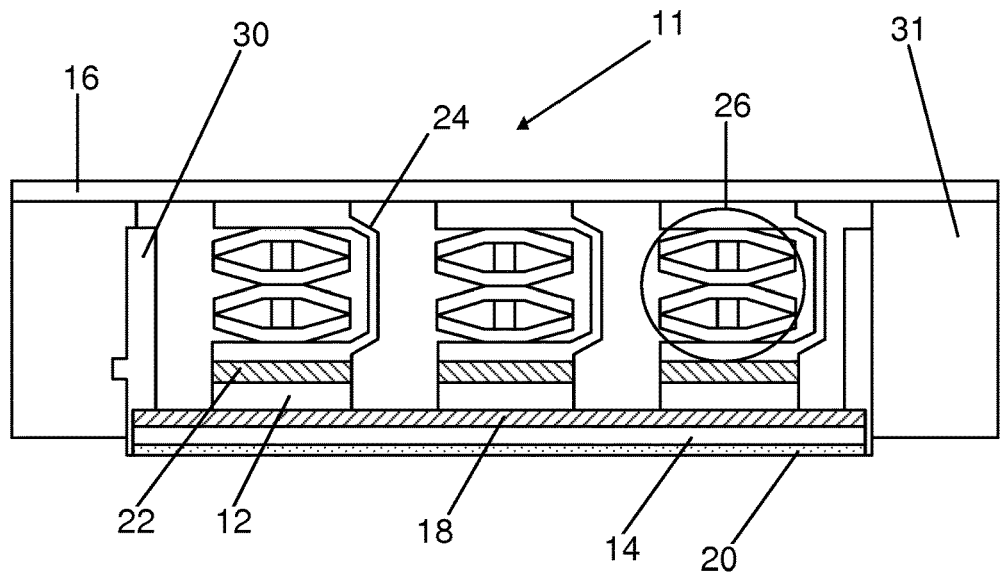

An exemplifying submodule 11 of the semiconductor power module to is schematically shown in FIG. 2.

In the submodule 11 there is a base plate 14, which is made of a metal such as Molybdenum and enclosed by an inner frame 30 and an outer frame 31, which frames may be made of a plastic material. On this base plate 14 a number of semiconductor chips 12 are placed. In the example there are six chips provided in two rows. In the figure only one row with three chips is shown. Moreover, a first side of the base plate 14 facing the chips 12 is covered by a first material section 18, where a second opposite side of the base plate 14 is covered by a second material section 20. Moreover each chip 12 is connected to an upper plate 16 via a corresponding third material section 22, a current bypass element 24, typically made of copper, and a spring 26. Here the upper plate 16, which may also be of copper, presses down on an upper part of the current bypass element 24 with is biased via the spring 26 against a lower part of the same in order to ensure a galvanic contact between the chip 12 and upper plate 16 via the third material section 22 as well as between the chip 12 and base plate 14 via the first material section 18.

It may here be mentioned that the structure shown in FIG. 2 is merely one way of realizing a submodule and that the chips may be electrically connected in series or parallel with each other.

Figure 3:
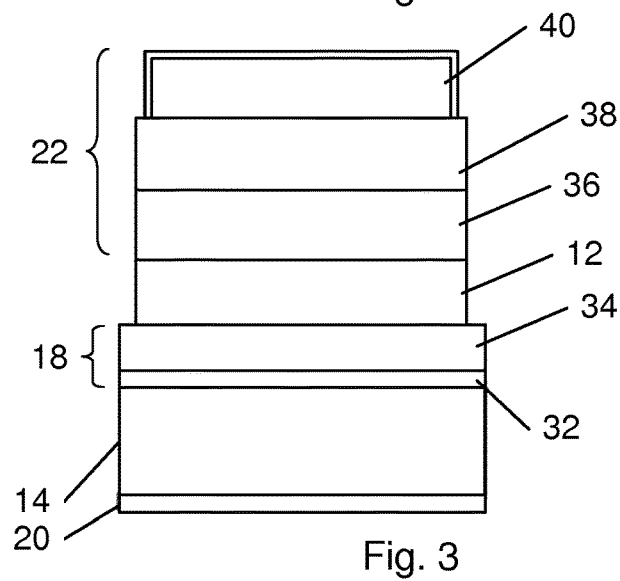

FIG. 3 shows relevant parts of the structure of the submodule 11 in FIG. 2 for one of the semiconductor chips 12 in more detail.

The first material section 18 below the chip 12 in this case comprises a first layer of graphene 32 electrically and thermally in contact with the first side of the base plate 14, which graphene layer 32 is with advantage 1-10 nm and preferably 2-4 nm thick. The first material section 18 furthermore comprises, on top of the first graphene layer 32 and below the chip 12, a first metallic layer 34 with a low melting point, which melting point may be in the range 500-700° C. This layer 34, which is placed on top of the graphene layer 32, may be a layer that is based on aluminum or silver or it may be an alloy based on aluminum or silver, such as an aluminum silver alloy or an aluminum silicon carbide alloy. This layer may thus be Al or Al—Ag alloy or AlSiC or any other suitable metal alloy having high thermal and electrical conductivity and with low melting point (e.g., <700 or 650). The thermal conductivity of the first metallic layer 34 may be above 1.5 W/cm-K and with advantage in the range of 1.5-4.5 W/cm-K, where in case Al is used the thermal conductivity may be 2.0 W/cm-K, in case Ag is used it may be 4.2 W/cm-K and in case AlSiC is used it may be in the range 1.8-2.1.

The second material section 20 in turn comprises a second layer of graphene in electrical and thermal contact with the second side of the base plate 14, which layer is with advantage also 1-10 nm and preferably 2-4 nm thick.

Moreover, the third material section 22 comprises a second metallic layer 36 with low melting point, such as aluminum or an aluminum silver alloy, on top of the chip 12, an upper base plate in the form of a layer 38 of high melting point and good conductivity, for instance molybdenum, on top of the layer 36 and a chip terminal contact material 40 on top of layer 36, where the chip terminal contact 40 may be an emitter side contact of for instance copper. Thereby the base plate 14 may also form a collector side contact. It should here be realized that there are other ways in which the third material section 22 may be realized. The thermal conductivity of the second metallic layer 36 may be above 1.5 W/cm-K and with advantage in the range of 1.5-4.5 W/cm-K, where in case Al is used the thermal conductivity may be 2.0 W/cm-K, in case Ag is used it may be 4.2 W/cm-K and in case AlSiC is used it may be in the range 1.8-2.1.

Finally the semiconductor chip is in this embodiment a silicone carbide chip, which has a high meting point in the range of 2400 K.

Power dissipated in a SiC chip may be high. The two layers of graphene 20 and 32, which have excellent thermal conductivity properties, are provided in order to funnel away such heat and thus improve the thermal management in normal continuous operation of the chip 12.

Thin layers 20 and 32 of graphene are thus inserted around the Mo bottom plate 14, which is thereby sandwiched between the graphene layers 20 and 32. A comparative assessment of 2D (two dimensional) graphene with other traditional semiconductor materials is presented in table I below, As can be seen, graphene has superior electrical and thermal properties compared to other semiconductors such as silicone (Si), gallium arsenide (GaAs), indium phosphide (InP), silicon carbide (SiC) and gallium nitride (GaN).

TABLE I

| Property | Si | GaAs | InP | SiC | GaN | Graphene |
|---|---|---|---|---|---|---|
| Electron mobility ($cm^3/V \cdot s$) | 1400 | 8500 | 5400 | 950 | 1000 | >15000 |
| Hole mobility ($cm^3/V \cdot s$) | 450 | 400 | 200 | 120 | 30 | >15000 |
| Electron velocity ($\times 10^7$ cm/s) | 1.0 | 1.3 | 2.3 | 2.0 | 2.5 | 4-5 |
| Thermal conductivity (W/cm-K) | 1.5 | 0.55 | 0.68 | 4.9 | 1.3-1.5 | 48-53 |
| Young's modulus (GPa) | 140 | 85 | 61 | 450 | 295 | 1000 |

These graphene properties are summarized as follows:

Extremely thin material sheet, while still being very strong (5 times stronger than steel and much lighter),
Graphene is semi-metal or zero bandgap semiconductor,
Superb heat conductor (even far better than SiC, copper, diamond etc.),
More transparent than ITO (i.e., Indium tin oxide used in photovoltaics, touch screen displays) over much large spectral band, and
Easy growth/manufacturability on metal or semiconductor substrate.

Growth mechanisms through variety of techniques are well-established.

The purpose of the first and second metallic layers 34 and 36 with low melting point is to obtain a short-circuit failure mode. There the both the first and the second metallic layer 34 and 36 with low melting point will melt during a short-circuit and create an electrically conductive alloy with the semiconductor chip 12.

As there are two such metallic layers on both sides of the chip, the short-circuit is more reliable than if there is only one.

An SiC chip is typically thinner than a conventional Si-IGBT die. Similarly, large difference in the thermal expansion coefficient (CTE) of upper/lower metals 36 and 34 (e.g., CTE of Al, Ag and AlSiC is 19, 23, 7.5, respectively) with SiC chip (i.e., CTE of 2.7) combined with amount of the heat generated as a result of high current densities and high temperature may damage the chip surface and hence induce the short circuit condition. Note that the melting point of AlSiC (with 63% volume of SiC) is 557-613° C. and thermal conductivity stays around 1.7-2.1 W/cm-K.

Two new features have thus been introduced.

1: A new layer 34 of suitable metal and/or metal alloy with low melting point and high thermal and electrical conductivity underneath the SiC chip. This will help to attain stable short circuit formation (SCFM) once the SiC chip is failed.

2: One or two thin layers 20 and 32 of graphene material around the bottom Mo plate 14 for improved cooling and better thermal management of the power module.

As the first layer of graphene has a high electrical conductivity and high thermal conductivity it is clear that the reliability of entering the SCFM mode is not jeopardized. The improved cooling is therefore obtained while at the same retaining the reliability with which the SCFM mode is entered upon short-circuits.

In an analogous manner the first metallic layer has a thermal conductivity that is high enough to aid the graphene layers in the cooling of the chip while its ability to safely enter the SCFM mode is unaffected.

As mentioned above the chip is with advantage an SiC chip. It should however be realized that the chip may just as well be another type of chip of any of the above-mentioned semiconductor materials, such as for instance an Si chip.

Moreover the semiconductor chip is with advantage realized as a switch such as a transistor like an IGBT or MOSFET transistor or a thyristor such as an IGCT.

From the foregoing discussion it is evident that the present invention can be varied in a multitude of ways.

It shall consequently be realized that the present invention is only to be limited by the following claims.

The invention claimed is:

1. A semiconductor power module comprising:
an electrically and thermally conductive base plate,
a semiconductor chip,
a first layer of graphene between the semiconductor chip and the electrically and thermally conductive base plate, where the first layer of graphene is in electrical and thermal contact with a first side of the electrically and thermally conductive base plate,
a first metallic layer with a first low melting point on the first side of the semiconductor chip between the semiconductor chip and first layer of graphene,
a second metallic layer with a second low melting point on a second side of the semiconductor chip opposite the first side of the semiconductor chip, the first and second metallic layers being provided for obtaining a short-circuit failure mode of the semiconductor chip creating an electrically conducting alloy with the semiconductor chip,
an upper base plate on top of the second metallic layer, and
a top electrode on top of the upper base plate.

2. The semiconductor power module according to claim 1, further comprising a second layer of graphene on a second side of the electrically and thermally conductive base plate opposite the first side of the electrically and thermally conductive base plate.

3. The semiconductor power module according to claim 1, wherein a thickness of at least the first layer of graphene is in a range 1-10 nm.

4. The semiconductor power module according to claim 1, wherein the first low melting point is in a range 500-700° C.

5. The semiconductor power module according to claim 4, wherein the first metallic layer has a thermal conductivity that is above 1.5 W/cm-K.

6. The semiconductor power module according to claim 5, wherein the thermal conductivity is in a range of 1.5-4.5 W/cm-K.

7. The semiconductor power module according to claim 1, wherein the first metallic layer includes a metal alloy.

8. The semiconductor power module according to claim 1, wherein the first metallic layer includes aluminum and/or silver.

9. The semiconductor power module according to claim 7, wherein the metal alloy is an aluminum silver alloy or an aluminum silicon carbide alloy.

10. The semiconductor power module according to claim 1, wherein the semiconductor chip is a silicon carbide chip.

11. The semiconductor power module according to claim 1, wherein the electrically and thermally conductive base plate is of molybdenum.

12. The semiconductor power module according to claim 1, further comprising a number of additional semiconductor chips, each connected to the electrically and thermally conductive base plate via the first layer of graphene.

13. The semiconductor power module according to claim 1, wherein a thickness of at least the first layer of graphene is in a range 2-4 nm.

14. The semiconductor power module according to claim 2, wherein a thickness of at least the first layer of graphene is in a range 1-10 nm.

15. The semiconductor power module according to claim 2, wherein the first low melting point is in a range 500-700° C.

16. The semiconductor power module according to claim 2, wherein the first metallic layer includes a metal alloy.

17. The semiconductor power module according to claim 16, wherein the metal alloy is an aluminum silver alloy or an aluminum silicon carbide alloy.

18. The semiconductor power module according to claim 2, wherein the semiconductor chip is a silicon carbide chip.

19. The semiconductor power module according to claim 2, wherein the electrically and thermally conductive base plate is of molybdenum.

20. The semiconductor power module according to claim 1, wherein the first and second low melting points are the same.

\* \* \* \* \*